(12) United States Patent
Li

(10) Patent No.: US 12,107,200 B2
(45) Date of Patent: Oct. 1, 2024

(54) BACKPLANE AND LIGHT EMITTING DIODE PANEL

(71) Applicant: TCL CHINA STAR OPTOELECTRONICS TECHNOLOGY CO., LTD., Shenzhen (CN)

(72) Inventor: Lanyan Li, Shenzhen (CN)

(*) Notice: Subject to any disclaimer, the term of this patent is extended or adjusted under 35 U.S.C. 154(b) by 471 days.

(21) Appl. No.: 17/434,774

(22) PCT Filed: Dec. 18, 2020

(86) PCT No.: PCT/CN2020/137789
§ 371 (c)(1),
(2) Date: Aug. 30, 2021

(87) PCT Pub. No.: WO2022/099862
PCT Pub. Date: May 19, 2022

(65) Prior Publication Data
US 2022/0406965 A1 Dec. 22, 2022

(30) Foreign Application Priority Data
Nov. 13, 2020 (CN) .......................... 202011269903.1

(51) Int. Cl.
*H01L 33/60* (2010.01)
*H01L 25/075* (2006.01)
*H01L 33/10* (2010.01)
*H01L 33/62* (2010.01)

(52) U.S. Cl.
CPC .......... *H01L 33/60* (2013.01); *H01L 25/0753* (2013.01); *H01L 33/10* (2013.01); *H01L 33/62* (2013.01)

(58) Field of Classification Search
None
See application file for complete search history.

(56) References Cited

U.S. PATENT DOCUMENTS

2012/0018759 A1   1/2012   Ohta
2014/0159043 A1*  6/2014   Sakariya ............. H01L 25/0753
                                                      438/34
2017/0062671 A1   3/2017   Hashimoto et al.
2020/0058829 A1   2/2020   Kim et al.
2020/0266326 A1   8/2020   Ichikawa et al.

FOREIGN PATENT DOCUMENTS

| CN | 101090128 A | 12/2007 |
|---|---|---|
| CN | 101946317 A | 1/2011 |
| CN | 203151858 U | 8/2013 |
| CN | 103474583 A | 12/2013 |
| CN | 105098091 A | 11/2015 |
| CN | 106057822 A | 10/2016 |
| CN | 106129089 A | 11/2016 |
| CN | 106165131 A | 11/2016 |

(Continued)

Primary Examiner — Feifei Yeung Lopez

(57) ABSTRACT

A backplane includes a drive substrate, a buffer layer, and a reflective layer. The buffer layer is disposed on the drive substrate. The reflective layer is disposed on the buffer layer. In the present disclosure, the buffer layer is provided on the drive substrate to protect the drive substrate during a screen printing process of the reflective layer. An light emitting diode panel is also provided.

16 Claims, 5 Drawing Sheets

(56) References Cited

FOREIGN PATENT DOCUMENTS

| | | | |
|---|---|---|---|
| CN | 108549499 | A | 9/2018 |
| CN | 108591974 | A | 9/2018 |
| CN | 109244111 | A | 1/2019 |
| CN | 109390286 | A | 2/2019 |
| CN | 109445179 | A | 3/2019 |
| CN | 111146163 | A | 5/2020 |
| CN | 111477618 | A | 7/2020 |
| CN | 111477653 | A | 7/2020 |
| CN | 111524927 | A | 8/2020 |
| CN | 111524931 | A | 8/2020 |
| KR | 20060095829 | A | 9/2006 |
| WO | 2013018783 | A1 | 2/2013 |

* cited by examiner

BACKPLANE AND LIGHT EMITTING DIODE PANEL

TECHNICAL FIELD

The present disclosure relates to a field of display technology, and more particularly to a backplane and a light emitting diode panel.

BACKGROUND

In manufacturing processes of a substrate for a micro light emitting diode (micro-LED) or a mini light emitting diode (mini-LED), it is often necessary to form a white oil layer on the substrate, and a white oil process generally uses a screen printing process or a spray printing process. The screen printing process has higher precision, but there is a direct contact with the substrate, which is easy to scratch the substrate and cause a short circuit in a metal layer. The spray printing process can avoid direct contact with the substrate and can effectively avoid scratching the substrate, but accuracy of its printing is difficult to guarantee. It is easy for white oil to overflow to a bonding pad area of a light emitting diode, causing oxidation and discoloration of a bonding pad, resulting in abnormal tinning and the light emitting diode cannot be normally printed.

SUMMARY

The present disclosure provide a backplane and a light emitting diode panel, which can solve the technical problem that a traditional light emitting diode substrate is easily scratched when a white oil reflective layer is made by the screen printing process.

Embodiments of the present disclosure provide a backplane, including:

a drive substrate;

a buffer layer, wherein the buffer layer is disposed on the drive substrate; and a reflective layer, wherein the reflective layer is disposed on the buffer layer.

In the backplane of the embodiments of the present disclosure, the buffer layer includes a base layer and a hole structure and/or a flexible particle disposed in the base layer.

In the backplane of the embodiments of the present disclosure, a flexibility of the flexible particle is greater than that of the base layer.

In the backplane of the embodiments of the present disclosure, the hole structure includes a gas space.

In the backplane of the embodiments of the present disclosure, the hole structure further includes a shell, and the shell wraps the gas space.

In the backplane of the embodiments of the present disclosure, a hole is provided on a side of the base layer close to the reflective layer, and the hole is connected with the gas space.

In the backplane of the embodiments of the present disclosure, a material of the buffer layer includes a photoresist material.

In the backplane of the embodiments of the present disclosure, the drive substrate includes a base and a conductive pad disposed on the base; a channel and an opening is defined on the buffer layer, the opening exposes the conductive pad, and the channel is disposed around the opening; and the buffer layer includes a retaining wall, the retaining wall is disposed between the channel and the opening, and the retaining wall is disposed around the opening.

In the backplane of the embodiments of the present disclosure, the conductive pad includes a reflective metal layer, the retaining wall and the reflective metal layer are partially overlapped.

In the backplane of the embodiments of the present disclosure, the channel is provided with a undercut structure, and the undercut structure extends in a direction of the retaining wall; in a direction from the drive substrate to the retaining wall, a width of the undercut structure decreases; and the reflective layer extends into the undercut structure.

In the backplane of the embodiments of the present disclosure, the channel is fully filled with the reflective layer.

In the backplane of the embodiments of the present disclosure, the drive substrate further includes a first metal layer, an insulating layer, a second metal layer, and a passivation layer sequentially disposed on the base, the second metal layer includes the conductive pad, and the opening penetrates the passivation layer.

In the backplane of the embodiments of the present disclosure, a thickness of the buffer layer is greater than or equal to 3 micrometers and less than or equal to 10 micrometers.

The embodiments of the present disclosure also relates to a light emitting diode panel, the light emitting diode panel includes a light emitting diode chip and a backplane, and the light emitting diode chip is disposed on the backplane.

Specifically, for example, the backplane of the LED panel includes:

a drive substrate;

a buffer layer, wherein the buffer layer is disposed on the drive substrate; and a reflective layer, wherein the reflective layer is disposed on the buffer layer.

In the light emitting diode panel of the embodiments of the present disclosure, the buffer layer includes a base layer and a hole structure and/or a flexible particle disposed in the base layer.

In the light emitting diode panel of the embodiments of the present disclosure, a flexibility of the flexible particle is greater than that of the base layer.

In the light emitting diode panel of the embodiments of the present disclosure, the hole structure includes a gas space.

In the light emitting diode panel of the embodiments of the present disclosure, the hole structure further includes a shell, and the shell wraps the gas space.

In the light emitting diode panel of the embodiments of the present disclosure, a hole is provided on a side of the base layer close to the reflective layer, and the hole is connected with the gas space.

In the light emitting diode panel of the embodiments of the present disclosure, a material of the buffer layer includes a photoresist material.

In the light emitting diode panel of the embodiments of the present disclosure, the drive substrate includes a base and a conductive pad disposed on the base; a channel and an opening is defined on the buffer layer, the opening exposes the conductive pad, and the channel is disposed around the opening; and the buffer layer includes a retaining wall, the retaining wall is disposed between the channel and the opening, and the retaining wall is disposed around the opening.

The backplane and the light emitting diode panel of the present disclosure are provided with a buffer layer on the drive substrate, and then play a role of protecting the drive substrate when the screen printing process of the reflective layer is performed. In addition, a channel is provided on the buffer layer and a retaining wall is disposed around an opening to prevent the material of the reflective layer from overflowing onto the conductive pad exposed by the opening during the spray printing process of the reflective layer.

DESCRIPTION OF DRAWINGS

In order to explain the embodiments of the present disclosure more clearly, the following briefly introduces the drawings that need to be used in the embodiments. The drawings in the following description are only part of the embodiments of the present disclosure. For those of ordinary skill in the art, other drawings can be obtained based on these drawings without creative work.

DETAILED DESCRIPTION OF PREFERRED EMBODIMENTS

The technical solutions in the embodiments of the present disclosure will be clearly and completely described below in conjunction with the drawings in the embodiments of the present disclosure. Obviously, the described embodiments are only a part of the embodiments of the present disclosure, rather than all the embodiments. Based on the embodiments in the present disclosure, all other embodiments obtained by those skilled in the art without creative work shall fall within the protection scope of the present disclosure.

In the present disclosure, unless expressly stipulated and limited otherwise, the "on" of the first feature on the second feature may include the first feature and second feature in direct contact, or the first feature and second feature are not in direct contact but through another feature between them.

Figure 1:
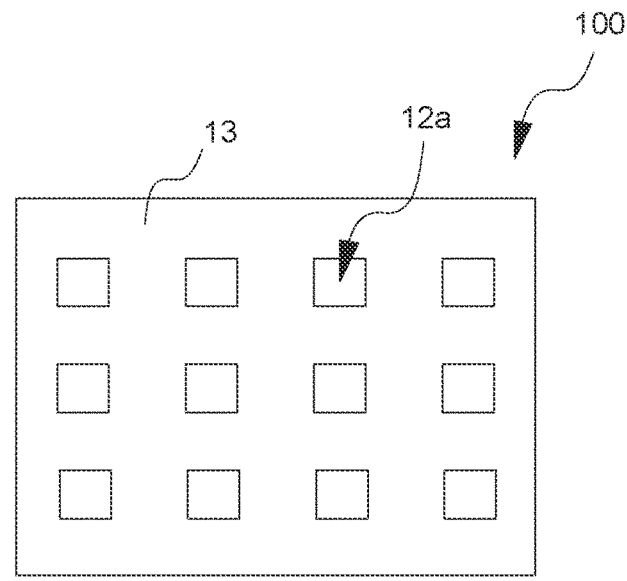
FIG. 1 is a schematic diagram of a top view structure of a backplane provided by a first embodiment of the present disclosure.
Figure 2:
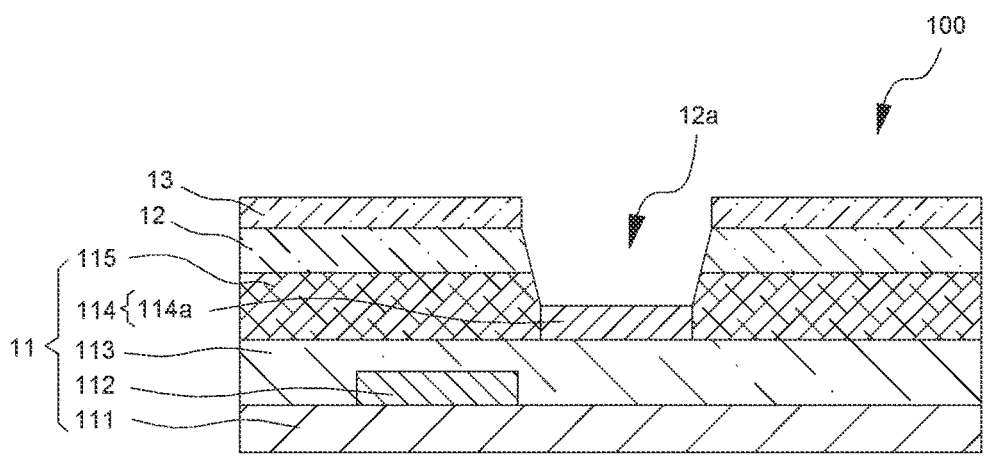
FIG. 2 is a schematic cross-sectional structure diagram of the backplane provided by the first embodiment of the present disclosure.

Referring to FIG. 1 and FIG. 2, FIG. 1 is a schematic diagram of a top view structure of a backplane provided by a first embodiment of the present disclosure. FIG. 2 is a schematic cross-sectional structure diagram of the backplane provided by the first embodiment of the present disclosure.

The embodiment of the present disclosure provide a backplane 100, which includes a drive substrate 11, a buffer layer 12, and a reflective layer 13. The buffer layer 12 is disposed on the drive substrate 11. The reflective layer is disposed on the buffer layer 12.

In the backplane 100 of the first embodiment, the buffer layer 12 is provided on the drive substrate 11. When the reflective layer 13 is formed on the buffer layer 12 by a screen printing process in the first embodiment, a squeegee contacts the buffer layer 12, and the buffer layer 12 absorbs force exerted by the squeegee, thereby protecting the drive substrate 11.

An opening 12a is defined on the buffer layer 12. The drive substrate 11 includes a base 111 and a first metal layer 112, and an insulating layer 113, a second metal layer 114, and a passivation layer 115 sequentially disposed on the base 111. It should be noted that the drive substrate 11 further includes other film layers such as an active layer and a flat layer. Since a hierarchical structure of the drive substrate 11 is in prior art, it will not be repeated here.

Specifically, the second metal layer 114 includes a conductive pad 114a and a signal trace. The opening 12a penetrates the buffer layer 12 and the passivation layer 115. The opening 12a exposes the conductive pad 114a.

The opening 12a has a vertical cross-sectional shape with a wide top and a narrow bottom like an inverted trapezoid. Such arrangement is convenient for an LED chip to pass through the opening 12a quickly and be bound to the conductive pad 114a during subsequent binding.

Figure 3:
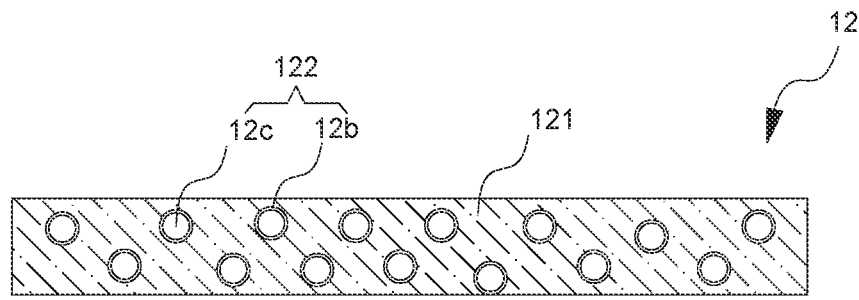
FIG. 3 is a schematic diagram of a structure of a buffer layer of the backplane provided by the first embodiment of the present disclosure.

Referring to FIG. 3, in the backplane 100 of the first embodiment, the buffer layer 12 includes a base layer 121 and a hole structure 122 disposed in the base layer 121. The hole structure 122 includes a shell 12b and a gas space 12c. The shell 12b wraps the gas space 12c.

During a screen printing process of the reflective layer 13, the squeegee contacts the buffer layer 12, and the hole structure 122 has an effect of absorbing the force of the squeegee, thereby preventing the squeegee from damaging the drive substrate 11.

It should be noted that the gas space 12c is formed by decomposing a material that can be thermally decomposed and/or photo-decomposed into gas. Therefore, the shell 12b plays a role of protecting and sealing the gas space 12c, preventing the gas from breaking the base layer 121, thereby ensuring flatness of a surface of the buffer layer 12 and providing a flat base surface for a formation of the reflective layer 13.

In addition, the "material that can be thermally decomposed and/or photo-decomposed" is simply referred to as a "decomposable material" hereinafter.

In some embodiments, the buffer layer 12 includes a flexible particle disposed in the base layer 121, namely, the hole structure 122 is replaced with the flexible particle. Wherein, a flexibility of the flexible particle is greater than a flexibility of the base layer 121. The flexible particle plays a role of absorbing the force of the squeegee.

In some embodiments, the buffer layer 12 also includes the flexible particle disposed in the base layer 121. Namely, the hole structure 122 and the flexible particle exist in the base layer 121 at a same time. Wherein, the flexibility of the flexible particle is greater than that of the base layer 121.

In the backplane 100 of the first embodiment, the reflective layer 13 is formed on the buffer layer 12. A material of the reflective layer 13 may be white ink, or other reflective materials that can be used in the screen printing process.

Optionally, a material of the buffer layer 12 includes a photoresist material. Specifically, a material of the base layer 121 of the buffer layer 12 may be the photoresist material such as polystyrene (PS) or soluble polytetrafluoroethylene (PFA).

Optionally, a thickness of the buffer layer 12 is greater than or equal to 3 micrometers and less than or equal to 10 micrometers. It should be noted that if the thickness of the buffer layer 12 is less than 3 micrometers, it will not have a good anti-scratch effect. If the thickness of the buffer layer 12 is greater than 10 micrometers, on one hand, cost will be increased, and on another hand, it will be inconvenient to bind the LED chip.

When the reflective layer 13 adopts the screen printing process, a preparation process of the backplane 100 of the first embodiment is as follows:

First, a base 111 is provided, and the first metal layer 112, the insulating layer 113, the second metal layer 114, and the passivation layer 115 are sequentially formed on the base 111 to form a thin film transistor array structure, that is, the drive substrate 11.

Then, a mixed material of a photoresist and particles is provided. The particles include the shell 12b and the decomposable material, and the shell 12b wraps the decomposable material.

Next, the mixed material is coated on the drive substrate 11 to form a mixed-material layer. The mixed-material layer is exposed, developed, and baked, and the decomposable material in the particles is decomposed to form the buffer layer 12 with the hole structure 122.

Secondly, the reflective layer 13 is formed on the buffer layer 12 by using the screen printing process.

Finally, cut according to product requirements.

In this way, the preparation process of the backplane 100 of the first embodiment is completed.

Figure 4:
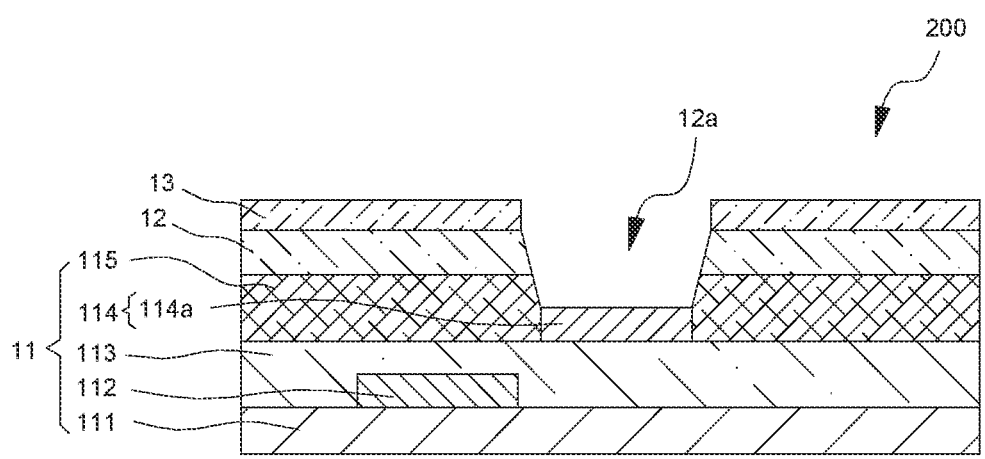
FIG. 4 is a schematic diagram of a structure of a backplane provided by a second embodiment of the present disclosure.

Referring to FIG. 4, FIG. 4 is a schematic diagram of a structure of a backplane provided by a second embodiment of the present disclosure. The backplane 200 of the second embodiment includes a drive substrate 11, a buffer layer 12, and a reflective layer 13 arranged in sequence. The drive substrate 11 includes a base 111, and a first metal layer 112, an insulating layer 113, a second metal layer 114, and a passivation layer 115 sequentially disposed on the base 111.

The second metal layer 114 includes a conductive pad 114a. An opening 12a is defined on the buffer layer 12. The opening 12a penetrates the buffer layer 12 and the passivation layer 115. The opening 12a exposes the conductive pad 114a.

Figure 5:
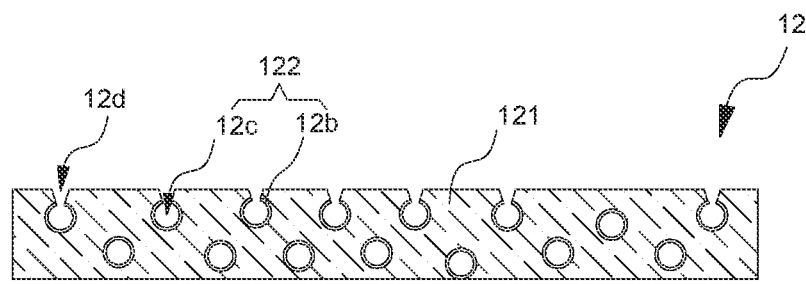
FIG. 5 is a schematic diagram of a structure of a buffer layer of the backplane provided by the second embodiment of the present disclosure.

A difference between the backplane 200 of the second embodiment and the backplane 100 of the first embodiment is: as shown in FIG. 5, a hole 12d is defined on the side of the base layer 121 close to the reflective layer 13.

A function of the hole 12d is to further absorb force of a squeegee on the buffer layer 12.

Optionally, at least part of a hole structure 122 in the buffer layer 12 is connected to the hole 12d.

It should be noted that gas generated after decomposition of decomposable materials breaks the base layer 121 to form the hole 12d. Since the decomposable materials are at different depths of the base layer 121, binding force of the decomposable materials of the different depths are different. Therefore, after the decomposable materials are decomposed into the gas, on a condition that an internal pressure of a gas space 12c is greater than binding force of the base layer 121 to it, it will break through the base layer 121 to form the hole 12d; and on a condition that the internal pressure of the gas space 12c is less than the binding force of the base layer 121 to it, the gas space 12c is completely bound in the base layer 121.

In the backplane 200 of the second embodiment, the hole structure 122 may include a shell 12b. The shell 12b is provided with an opening formed by being broken by gas.

In addition, in some embodiments, the hole structure 122 may also only include the gas space 12c. The decomposable materials are decomposed into the gas to form the gas space 12c, wherein the gas breaks a surface of the base layer 121 to form the hole 12d in the base layer 121.

Figure 6:
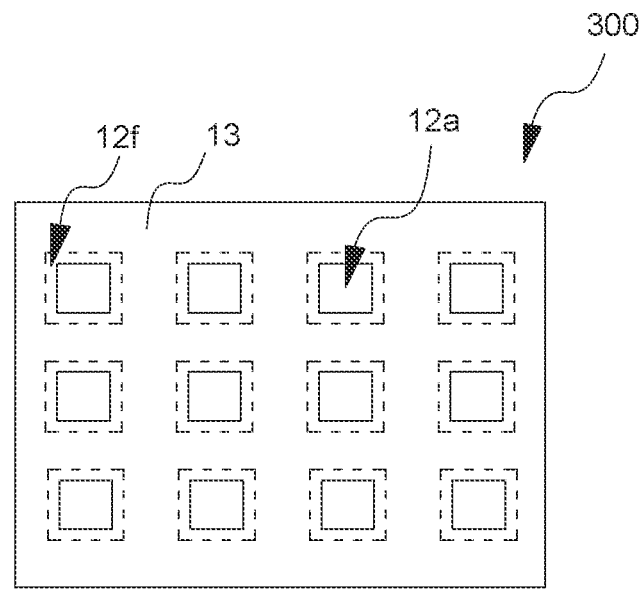
FIG. 6 is a schematic diagram of a top structure of a backplane provided by a third embodiment of the present disclosure.
Figure 7:
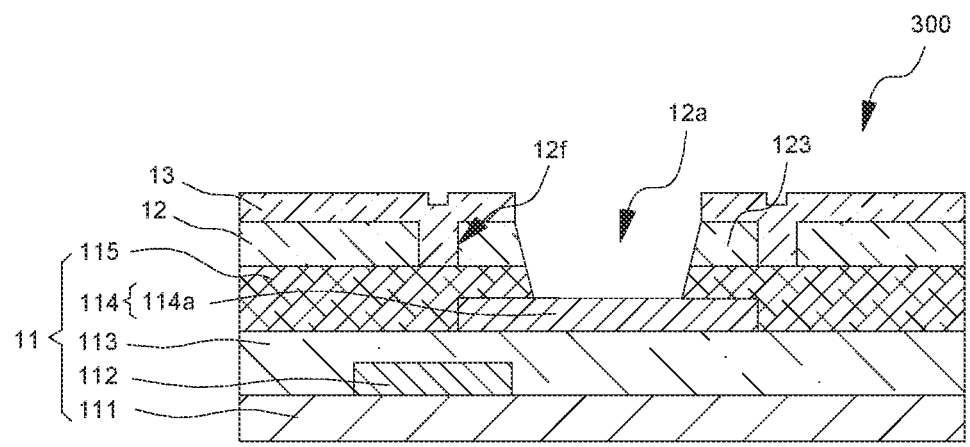
FIG. 7 is a schematic cross-sectional structure diagram of the backplane provided by the third embodiment of the present disclosure.

Referring to FIG. 6 and FIG. 7, FIG. 6 is a schematic diagram of a top structure of a backplane provided by a third embodiment of the present disclosure. FIG. 7 is a schematic cross-sectional structure diagram of the backplane provided by the third embodiment of the present disclosure.

The backplane 300 of the third embodiment includes a drive substrate 11, a buffer layer 12, and a reflective layer 13 arranged in sequence. The drive substrate 11 includes a base 111, and a first metal layer 112, an insulating layer 113, a second metal layer 114, and a passivation layer 115 sequentially disposed on the base 111.

The second metal layer 114 includes a conductive pad 114a. The buffer layer 12 is provided with an opening 12a. The opening 12a penetrates the buffer layer 12 and the passivation layer 115. The opening 12a exposes the conductive pad 114a.

A difference between the backplane 300 of the third embodiment and the backplane 100 of the first embodiment or the backplane 200 of the second embodiment is as follows:

On the basis of the backplane 100 of the first embodiment or the backplane 200 of the second embodiment, the buffer layer 12 is further provided with a channel 12f. The channel 12f is disposed around the opening 12a.

The buffer layer 12 includes a retaining wall 123 disposed between the channel 12f and the opening 12a, and the retaining wall 123 is disposed around the opening 12a.

In the backplane 300 of the third embodiment, the buffer layer 12 is provided on the drive substrate 11, and the channel 12f is formed on the buffer layer 12 to form the retaining wall 123.

Figure 8:
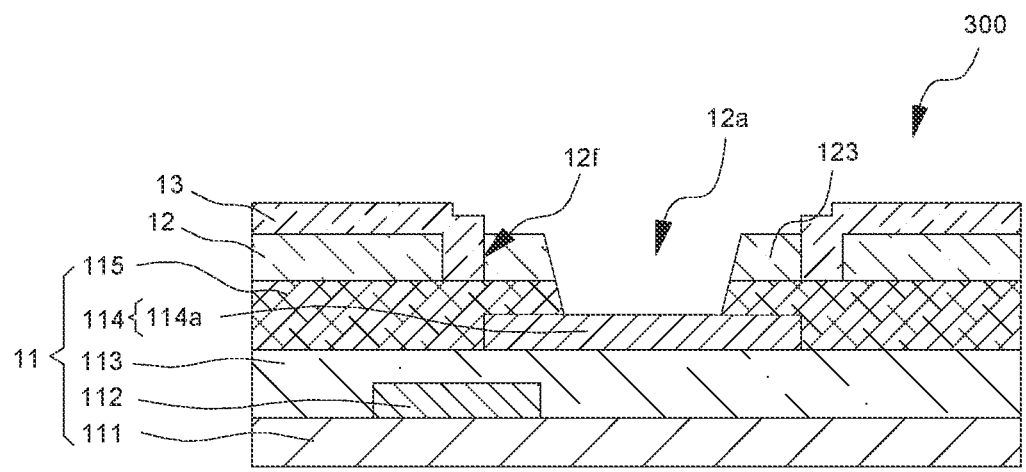
FIG. 8 is another schematic cross-sectional view of the backplane provided by the third embodiment of the present disclosure.

When the backplane 300 of the third embodiment adopts a spray printing process to form the reflective layer 13, a fluid material is sprayed on part of the buffer layer 12 except for the retaining wall 123. The fluid material overflows into the channel 12f and is blocked by the retaining wall 123 to prevent the fluid material from overflowing onto the conductive pad 114a and causing defects. Namely, the reflective layer 13 covers the channel 12f, as shown in FIG. 8.

When the backplane 300 of the third embodiment adopts a screen printing process to form the reflective layer 13, the reflective material is not only formed on the buffer layer 12, but also enters the channel 12f under an action of a squeegee.

Namely, the reflective layer 13 covers the buffer layer 12 and the channel 12f, as shown in FIG. 7.

Optionally, the conductive pad 114a includes a reflective metal layer. The retaining wall 123 overlaps a portion of the reflective metal layer. It should be noted that in the third embodiment, a term "overlapping" refers to an indirect overlapping.

Since the retaining wall 123 overlaps the reflective metal layer, light emitted by an LED chip passes through the retaining wall 123 and radiates to the reflective metal layer, and is reflected on the reflective metal layer in an LED panel produced later, thereby improving light utilization efficiency of the LED panel.

Optionally, the conductive pad 114a may have at least a two-layer structure, wherein the reflective metal layer is located on a side close to the retaining wall 123.

Optionally, the conductive pad 114a may also have a single-layer structure, namely, namely that the conductive pad 114a is composed of the reflective metal layer. A reflective metal may be silver, aluminum, or the like.

In addition, in a manufacturing process of the buffer layer 12, the channel 12f and the opening 12a are made of a same photomask.

Figure 9:
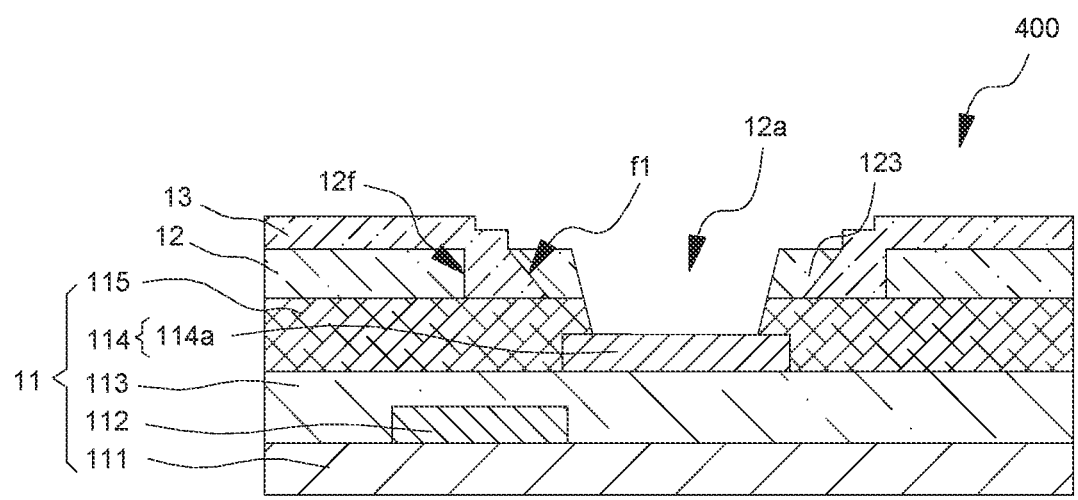
FIG. 9 is a schematic diagram of a structure of a backplane provided by a fourth embodiment of the present disclosure.

Referring to FIG. 9, FIG. 9 is a schematic diagram of a structure of a backplane provided by a fourth embodiment of the present disclosure. The backplane 400 of the fourth embodiment includes a drive substrate 11, a buffer layer 12, and a reflective layer 13 arranged in sequence. The drive substrate 11 includes a base 111, and a first metal layer 112, an insulating layer 113, a second metal layer 114, and a passivation layer 115 sequentially disposed on the base 111.

The second metal layer 114 includes a conductive pad 114a. The buffer layer 12 is provided with an opening 12a. The opening 12a penetrates the buffer layer 12 and the passivation layer 115. The opening 12a exposes the conductive pad 114a.

A difference between the backplane 400 of the fourth embodiment and the backplane 300 of the third embodiment is as follows: a channel 12f has an undercut structure f1, and the undercut structure f1 extends in a direction of the retaining wall 123. In a direction from the drive substrate 11 toward a retaining wall 123, a width of the undercut structure f1 decreases, and the reflective layer 13 extends into the undercut structure f1.

The fourth embodiment shows that the reflective layer 13 is formed by a spray printing process. A material of the reflective layer 13 fills an entire channel 12f, namely, the reflective layer 13 extends into the undercut structure f1. Therefore, in an LED panel produced subsequently, light emitted by an LED chip passes through the retaining wall 123 and radiates to the reflective layer 13 in the undercut structure f1. In addition, the light is reflected on the reflective layer 13, thereby improving light utilization efficiency of the LED panel.

When the reflective layer 13 is formed by a screen printing process, compared to the fourth embodiment, the reflective layer 13 also covers the retaining wall 123.

Figure 10:
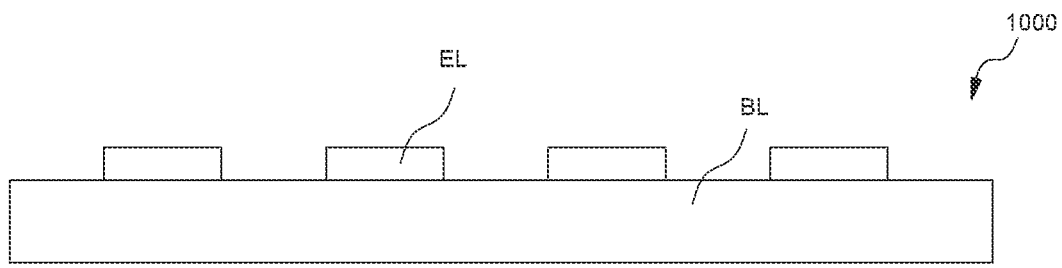
FIG. 10 is a schematic diagram of a structure of an light emitting diode panel provided by an embodiment of the present disclosure.

Referring to FIG. 10, FIG. 10 is a schematic diagram of a structure of an light emitting diode panel provided by an embodiment of the present disclosure. The embodiment of the present disclosure also relates to the LED panel 1000, which includes an LED chip EL and a backplane BL. The LED chip EL is disposed on the backplane BL. The backplane BL is the backplane (100, 200, 300, 400) described in any one of above embodiments.

It should be noted that an LED is a light emitting diode chip. The LED can be mini-LED, micro-LED, or other LEDs.

The backplane and the LED panel of the present disclosure are provided with the buffer layer on the drive substrate. The buffer layer plays a role of protecting the drive substrate when the screen printing process of the reflective layer is performed. In addition, the channel is provided on the buffer layer and the retaining wall surrounding the opening is formed to prevent the material of the reflective layer from overflowing onto the conductive pad exposed by the opening during the spray printing process of the reflective layer.

The backplane and the light emitting diode panel provided by the embodiments of the present disclosure are described in detail above, specific examples are used to explain the principle and implementation of the present disclosure, the descriptions of the above embodiments are only used to help understand the present disclosure technical solutions and their core ideas. Those of ordinary skill in the art should understand that they can still modify the technical solutions described in the foregoing embodiments, or equivalently replace some of the technical features. These modifications or replacements, and the essence of the corresponding technical solutions does not deviate from the scope of the technical solutions of the embodiments of the present disclosure.

What is claimed is:

1. A backplane, comprising:
   a drive substrate;
   a buffer layer, wherein the buffer layer is disposed on the drive substrate; and
   a reflective layer, wherein the reflective layer is disposed on the buffer layer;
   wherein the buffer layer comprises a base layer and a hole structure and/or a flexible particle disposed in the base layer;
   wherein the hole structure comprises a gas space.

2. The backplane of claim 1, wherein a flexibility of the flexible particle is greater than a flexibility of the base layer.

3. The backplane of claim 1, wherein the hole structure further comprises a shell, and the shell wraps the gas space.

4. The backplane of claim 3, wherein a hole is defined on a side of the base layer close to the reflective layer, and the hole is connected with the gas space.

5. The backplane of claim 1, wherein a material of the buffer layer comprises a photoresist material.

6. A backplane, comprising:
   a drive substrate;
   a buffer layer, wherein the buffer layer is disposed on the drive substrate; and
   a reflective layer, wherein the reflective layer is disposed on the buffer layer;
   wherein the drive substrate comprises a base and a conductive pad disposed on the base; a channel and an opening are defined on the buffer layer, the opening exposes the conductive pad, and the channel is disposed around the opening; and
   the buffer layer comprises a retaining wall, wherein the retaining wall is disposed between the channel and the opening, and the retaining wall is disposed around the opening.

7. The backplane of claim 6, wherein the conductive pad comprises a reflective metal layer, and the retaining wall and the reflective metal layer are partially overlapped.

8. The backplane of claim 6, wherein the channel is provided with a undercut structure, and the undercut structure extends in a direction of the retaining wall; in a direction from the drive substrate to the retaining wall, a width of the undercut structure decreases, and the reflective layer extends into the undercut structure.

9. The backplane of claim 6, wherein the channel is fully filled with the reflective layer.

10. The backplane of claim 6, wherein the drive substrate further comprises a first metal layer, an insulating layer, a second metal layer, and a passivation layer sequentially disposed on the base, the second metal layer comprises the conductive pad, and the opening penetrates the passivation layer.

11. The backplane of claim 1, wherein a thickness of the buffer layer is greater than or equal to 3 micrometers and less than or equal to 10 micrometers.

12. A light emitting diode panel, comprising a light emitting diode chip and a backplane, and the light emitting diode chip is disposed on the backplane; wherein the backplane comprises:
a drive substrate;
a buffer layer, wherein the buffer layer is disposed on the drive substrate; and
a reflective layer, wherein the reflective layer is disposed on the buffer layer;
wherein the buffer layer comprises a base layer and a hole structure and/or a flexible particle disposed in the base layer;
wherein the hole structure comprises a gas space.

13. The light emitting diode panel of claim 12, wherein a flexibility of the flexible particle is greater than a flexibility of the base layer.

14. The light emitting diode panel of claim 12, wherein the hole structure further comprises a shell, and the shell wraps the gas space.

15. The light emitting diode panel of claim 12, wherein a hole is defined on a side of the base layer close to the reflective layer, and the hole is connected with the gas space.

16. The light emitting diode panel of claim 12, wherein the drive substrate comprises a base and a conductive pad disposed on the base; a channel and an opening are defined on the buffer layer, the opening exposes the conductive pad, and the channel is disposed around the opening; and
the buffer layer comprises a retaining wall, wherein the retaining wall is disposed between the channel and the opening, and the retaining wall is disposed around the opening.

* * * * *